United States Patent [19]

Sanwo et al.

[11] Patent Number: 4,647,797

[45] Date of Patent: Mar. 3, 1987

[54] ASSIST CIRCUIT FOR IMPROVING THE RISE TIME OF AN ELECTRONIC SIGNAL

[75] Inventors: Ikuo J. Sanwo, San Marcos; Albert P. Chiu, San Diego; William O. Kerber, Escondido, all of Calif.

[73] Assignee: NCR Corporation, Dayton, Ohio

[21] Appl. No.: 643,506

[22] Filed: Aug. 23, 1984

[51] Int. Cl.[4] .......................... H03K 5/12; H03K 6/04
[52] U.S. Cl. ................................. 307/443; 307/263; 307/268; 307/270; 307/360; 307/572
[58] Field of Search ............... 307/443, 464, 475, 542, 307/572, 246, 268, 264, 270, 597, 595, 602, 360, 263, 482

[56] References Cited

U.S. PATENT DOCUMENTS 4,463,270 7/1984 Gordon ........................... 307/296 R
4,479,067 10/1984 Fujita ................................. 307/475
4,498,021 2/1985 Uya ..................................... 307/443

Primary Examiner—Stanley D. Miller
Assistant Examiner—Richard Roseen
Attorney, Agent, or Firm—Wilbert Hawk, Jr.; Edward Dugas; Floyd A. Gonzalez

[57] ABSTRACT

A circuit for improving the rise time of an electronic signal including a voltage generator for generating a reference voltage, a comparator for comparing the voltage of an electronic signal whose rise time is to be improved with the voltage of the reference voltage generator, and a current pulse generator controlled by the comparator for generating a current pulse of a predetermined duration responsive to the comparison of the comparator. The current pulse is of sufficient magnitude to assist the rise time of the electronic signal.

2 Claims, 3 Drawing Figures

ASSIST CIRCUIT FOR IMPROVING THE RISE TIME OF AN ELECTRONIC SIGNAL

BACKGROUND OF THE INVENTION

The present invention relates generally to a circuit for improving the rise time of an electronic signal, and more particularly to an assist circuit for improving the rise time of signals on conductors of an open-drain NMOS data transfer bus in a data processing system.

Data processing systems contain data transferred buses such as, for instance, a data bus between a processor and a memory. Assist circuits are known which, at or near the beginning of the processor to memory cycle, supply current to each conductor in the data bus to quickly set each conductor in the data bus to its inactive state. By use of such assist circuits, the processor does not need to supply all of the current to return the conductors in the data bus to their inactive states, but needs only to change selected conductors in the data bus to their active states which correspond to data to be transferred. In prior known bus assist circuits, the supply of current to the data bus conductors is controlled by a clock circuit which also controls the processor to memory cycle.

SUMMARY OF THE INVENTION

In the present invention, a circuit for improving the rise time of an electronic signal includes a voltage generator for generating a reference voltage, a comparator for comparing the voltage of an electronic signal whose rise time is to be improved with the voltage of the reference voltage generator, and a current pulse generator controlled by the comparator for generating a current pulse of a predetermined duration responsive to the comparison of the comparator. The current pulse is of sufficient magnitude to assist the rise time of the electronic signal.

The circuit of the present invention is particularly useful in a data processing system including the NCR-32 VLSI chip set available from the NCR Microelectonics Division, Colorado Springs, Colo., as explained in the publication NCR/32 General Information, RM-0480.

It is thus an object of the present invention to provide an assist circuit for improving the rise time of an electronic signal, from which a trigger signal is derived.

A further object of the present invention is to provide a bus assist circuit for assisting the rise time of an electronic signal on a data bus of a data processing system.

A further object of the invention is to provide a bus assist circuit for a data bus of a data processing system which does not have to be tuned to operate responsive to clock signals from a clock in the data processing system, but rather is triggered by a condition of an electronic signal on the data processing bus itself.

DESCRIPTION OF THE PREFERRED EMBODIMENT

Figure 1:
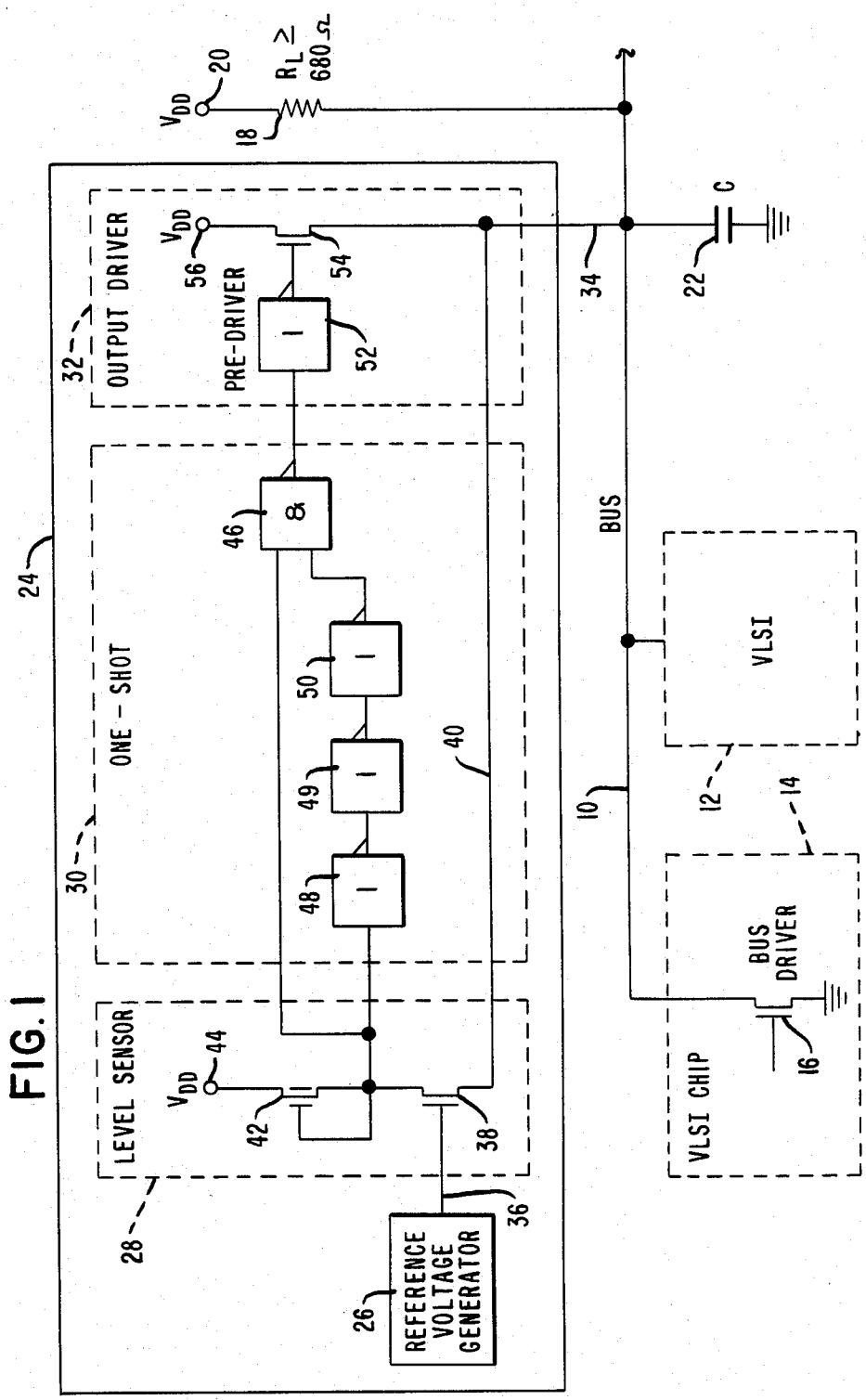
FIG. 1 is a block diagram of a simplified data processing system utilizing the bus assist circuit of the present invention.

FIG. 1 is a block diagram of a simplified data processing system having a data bus conductor (10) of a data bus extending between VLSI chips 12 and 14. The VLSI chips 12 and 14 may be selected from among the NCR/32 chip sets as described in the aforementioned publication RM-0480. For instance, chip 12 may be a central processor chip, and chip 14 may be an address translation chip. It will be understood that the data bus conductor 10 may extend to other devices in a data processing system such as memory or peripherals, or other known data processing devices. As is known, within the VLSI chips are bus driver circuits represented by the N-Channel enhancement MOS transistor 16 which are turned on and off by the circuitry of the VLSI chip to change the state of the signal on the data conductor 10, from its inactive state to its active state. In the illustrated embodiment, the inactive state of a signal on the data bus is a high, and the active state is a low.

It will be understood that at the end of a data cycle, old data must be removed from the bus conductor 10, and new data must be placed on the bus conductor 10 by the proper data processing element, before a new data cycle can be started. For instance, if the signal on the data bus conductor 10 was low, or active, and the new data requires that the signal on the conductor go to its high or inactive state, then the new data cannot be read from the data bus until the change from the low active state to the high inactive state on that conductor has been accomplished. The bus assist circuit of the present invention does this by monitoring the voltage state on each bus conductor 10 of the data bus. When the voltage on a bus conductor 10 rises by a predetermined amount, a pulse of current is input by the bus assist circuit of the present invention to bus conductor 10. This results in a shortened rise time of the voltage level on that conductor, thus shortening the time needed for the voltage on the bus conductor 10 to recover, thereby shortening the time needed between reading data from the data bus.

A load resistor 18 is provided having one end connected to a voltage source $V_{DD}$ at terminal 20, and its other end connected to the data bus conductor 10. An equivalent capcitance 22 is shown between the bus conductor 10 and ground and is added to the diagram of FIG. 1 for clarity only. The capacitor 22 represents the equivalent capacitance presented by the VLSI chips 12 and 14 connected to the bus conductor 10 plus the distributed capacitance of this conductor. It has been found that this equivalent capacitance represented by capacitor 22 may be as high as 100 picofarads. In order to keep the RC time constant within the desired range, the load resistor 18 of the present embodiment is sized to be equal to or greater than 680 ohms to guarantee acceptable logic low level at the data bus conductor 10.

The bus assist circuit of the present invention is represented by circuit 24 of FIG. 1, and includes a reference voltage generator 26, a voltage level sensor circuit 28 which senses the voltage level on the bus conductor 10 and compares it to the output voltage of the reference voltage generator 26, a one-shot circuit 30 which is triggered by the output of level sensor circuit 28, and an output driver circuit 32 controlled by the one-shot circuit 30 for outputting a current pulse, over output conductor 34, to the data bus conductor 10 in the data bus.

Figure 3:
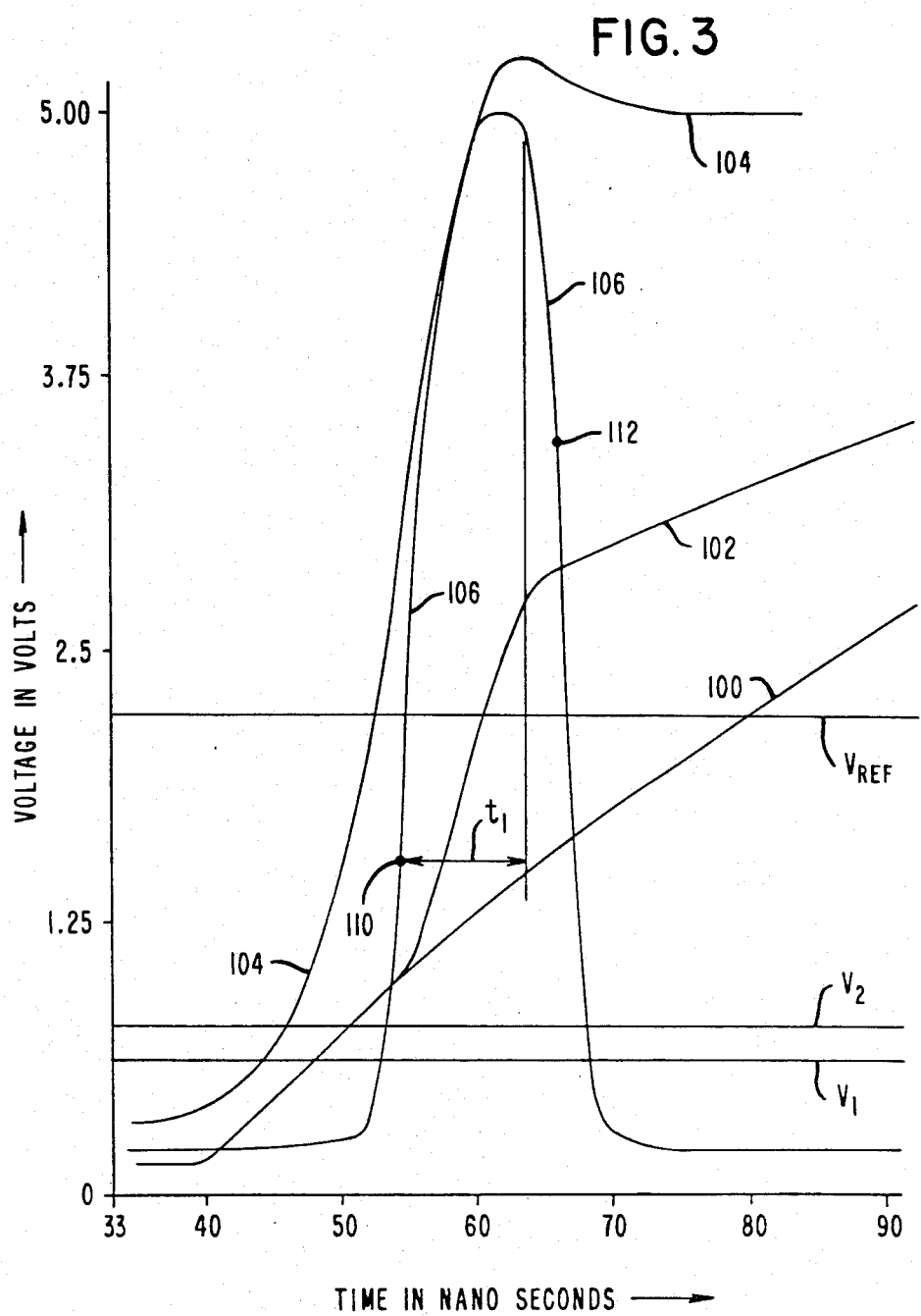
FIG. 3 is a diagram showing voltage waveforms of the bus voltage both with and without the bus assist circuits of FIGS. 1 and 2, and voltage waveforms at other nodes in the bus assist circuits of FIGS. 1 and 2.

FIG. 3 shows a portion of voltage waveforms on the bus conductor 10, both without the bus assist circuit 24 of FIG. 1, and with the bus assist circuit 24. Waveform 100 is the normal voltage on the bus conductor 10 during the rise time of the voltage as it would appear without the bus assist circuit 24, and waveform 102 is the voltage on the bus conductor 10 with a shortened rise time due to the presence of the bus assist circuit 24. Waveform 104 is the voltage on the drain of a voltage level comparator transistor 38 of the voltage level sensor 28, to be discussed, and waveform 106 is the gate voltage of a driver transistor 54 of the output driver circuit 32, to be discussed.

The reference voltage generator 26 may be any one of the various known reference voltage generator circuits. The output 36 of of the reference voltage generator 26 outputs a constant voltage of about 2.2 volts (see $V_{REF}$ of FIG. 3) which is applied to the gate of an N-channel enhancement MOS transistor 38 whose source is connected by conductor 40 to the output conductor 34 of the bus assist circuit 24. The drain of transistor 38 is connected to the source of an N-channel depletion transistor 42 whose drain is connected to the voltage source $V_{DD}$ at terminal 44, as shown. The transistor 38 acts as a comparator for the level sensor circuit 28. The transistor 38 is turned on when the voltage on data bus conductor 10 is low thereby grounding the current output of transistor 42. It will be understood that when the voltage on the source of transistor 38 rises sufficiently close to the reference voltage on the gate of the transistor 38, that the gate to source voltage will be less than the threshold voltage of transistor 38, and the transistor 38 will turn off. Thus, when the voltage on the data bus conductor 10 rises between 0.63 and 0.76 volts ($V_1$ and $V_2$ of FIG. 3, respectively), the transistor 38 turns off, thereby diverting the current output from transistor 42 to the output of the level sensor circuit 28.

The output of the level sensor circuit 28 is connected to the input of the one-shot circuit 30 which includes a NAND gate 46, and a series of three inverters 48, 49 and 50. The series of inverters 48, 49 and 50 act as a timing device predicating a fixed length of time for the input signal to be propagated through the series to the NAND gate 46. It will be understood that the timing of the one-shot device may be lengthened or shortened by adding or removing inverters, but that the number of inverters should be an odd number to accomplish the one-shot operation of the circuit. In the disclosed embodiment, the propagation time of the series of inverters 48, 49 and 50 is a total of about 10 nanoseconds ($t_1$ of FIG. 3).

As the voltage on the bus conductor 10 goes low, the output of the level sensor circuit 28 will be pulled low, driving its subsequent inverter 48 to output a high, the inverter 49 to output a low and the inverter 50 to output a high. This high will be applied to one input of NAND gate 46, while the other input of NAND gate 46 was already at low, following immediately the output of the level sensor circuit 28. Thus, with one input low and one input high, the output of NAND gate 46 will be high. This high will be outputted by the one-shot circuit 30 to the input of the output driver circuit 32.

The output driver circuit 32 includes a predriver inverter 52, and a driver transistor represented by an N-channel enhancement MOS transistor 54. The source of transistor 54 is connected to the output conductor 34, the gate is connected to the output of pre-driver inverter 52, and the drain is connected to the voltage source $V_{DD}$ at terminal 56. Thus, in the condition previously explained, the high from NAND gate 46 is applied to the input of inverter 52 which is converted to a low on the gate of transistor 54 holding transistor 54 in the off condition.

As the voltage on bus conductor 10 rises to somewhere between 0.63 and 0.76 volts, transistor 38 is turned off as previously explained. The current from transistor 42 is increasingly applied to the input of one-shot circuit 30 causing the voltage thereon to rise to a high (see 104 of FIG. 3). This high is applied to the input of NAND gate 46 which, with the prior high on its other input, changes its output to a low. This low is inverted by pre-driver inverter 52 of the output driver circuit 32 to a high which is applied to the gate of transistor 54, turning on transistor 54 and allowing current to pass from the voltage source terminal 56 to the output conductor 34 onto the data bus conductor 10. It will be understood that the transistor 54 will not turn on until the difference between its gate voltage (waveform 106 of FIG. 3) and the voltage on the bus conductor 10 (waveform 102 of FIG. 3) exceeds the threshold voltage of the transistor 54, in this case about 0.566 volts.

The high on the input of one-shot circuit 30 is also applied to the series of inverters made up of inverters 48, 49 and 50. After the approximately 10 nanosecond propagation time of the series of inverters 48, 49 and 50, ($t_1$ of FIG. 3), the output of inverter 50 goes low, which with the high on the other input of NAND gate 46 causes the output of the NAND gate 46 to go high. This high is inverted by pre-driver inverter 52 to a low which is applied to the gate of transistor 54, thereby turning off transistor 54 and terminating the current output by the bus assist circuit 24 after the 10 nanosecond period. It will be understood that the transistor 54 turns off at 112 of FIG. 3 when the difference between its gate voltage of waveform 106 and the voltage of waveform 102 on the bus conductor 10 falls below the threshold voltage of the transistor 54.

When the voltage on the bus conductor 10 again drops to its active state by the action of, for instance, a bus driver transistor 16, the voltage on the source of the transistor 38 will drop sufficiently below the output voltage from reference voltage generator 26 on the gate of transistor 38. Transistor 38 will turn on, grounding the current from transistor 42, causing the voltage on one input of NAND gate 46 to be low and the voltage on the other input, from inverter 50, to be low. Thus, the output of NAND gate 46 will stay high, which will be inverted by inverter 52, thereby holding transistor 54 off.

After the propagation time of the inverter series 48, 49 and 50, the output of the inverter 50 will change to high. The output of the NAND gate 46 will still remain high, which is inverted by the predriver circuit 52 to hold transistor 54 off. In this manner, the circuit will be reset to assist the next rise of voltage on the data bus conductor 10 as previously explained.

Figure 2:
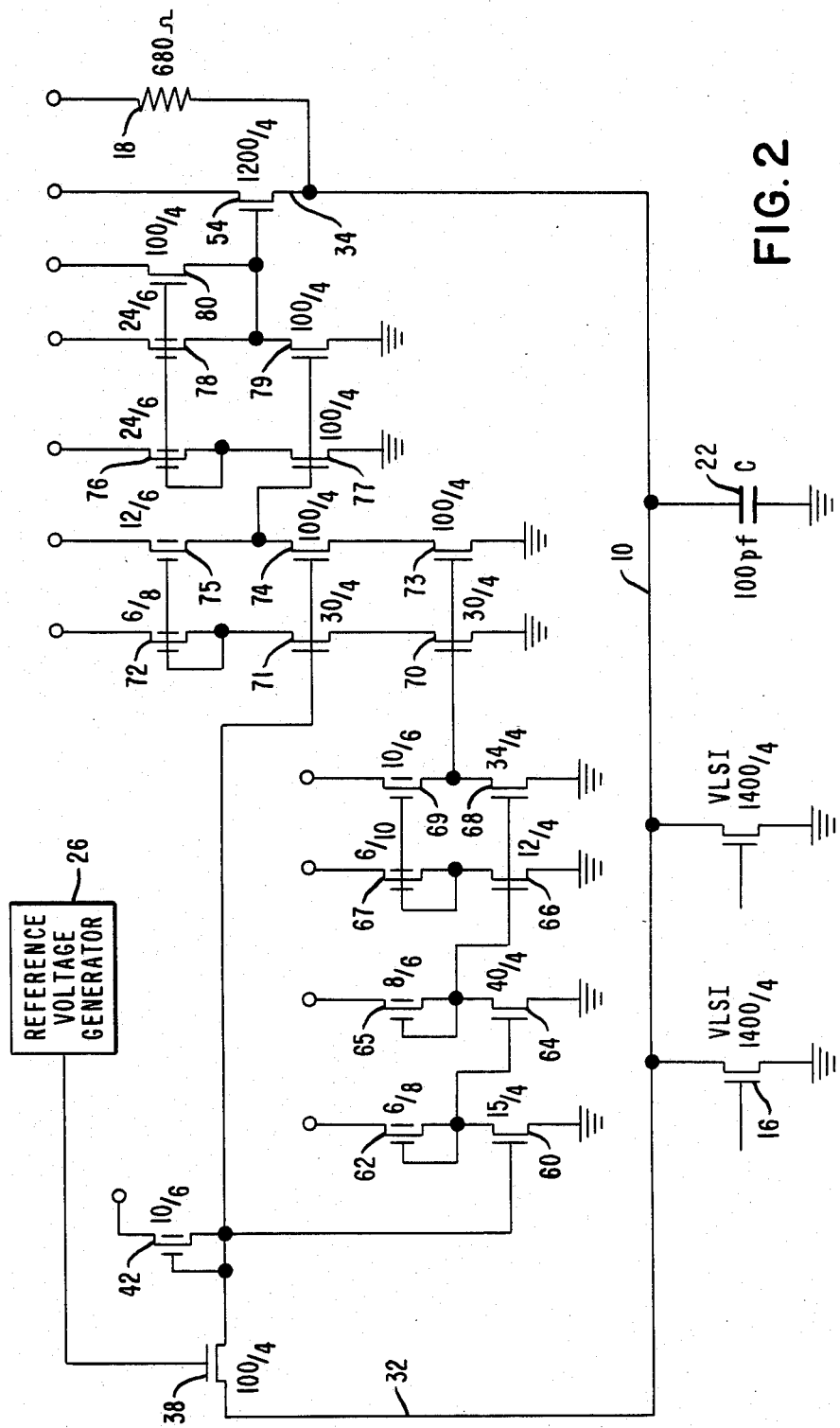
FIG. 2 is a schematic diagram of the bus assist circuit of FIG. 1.

FIG. 2 is a schematic diagram of the bus assist circuit of FIG. 1, showing the connection of the bus driver transistors of the VLSI chips 12 and 14, the connection of the equivalent parasitic capacitance represented by capacitor 22, and the connection of pull-up resistor 18. The numbers beside the transistors, such as 100/4 next to transistor 38, represents the physical dimensions of the polysilicon gate of the transistors in microns. Thus, for transistor 38, the polysilicon gate is 100 microns wide and 4 microns long. It will be noted that the gate of the bus driver transistors of VLSI chips 12 and 14, such as transistor 16, is 1,400 microns wide and 4 microns long. This represents a large current sink which, when turned on, rapidly discharges the voltage on the data bus conductor 10. Transistors 38, 42 and 54 are the same as the transistors shown in FIG. 1. The reference voltage generator 26 of FIGS. 1 and 2 is also the same. N-channel depletion MOS transistor 62 and enhancement transistor 60 of FIG. 2 form inverter 48 of FIG. 1. Transistors 65 and 64 of FIG. 2 form inverter 49 of FIG. 1, and transistors 67 and 66 of FIG. 2 form inverter 50 of FIG. 1. Transistors 69 and 68 form a superdriver output for the inverter 50 of FIG. 1.

Transistors 70, 71, 72, 73, 74 and 75 of FIG. 2 form the NAND gate 46 and a superdriver output for the NAND gate 46 of FIG. 1. Transistors 76, 77, 78 and 79 of FIG. 2 form the pre-driver inverter 52 of FIG. 1, and its superdriver output. Transistor 80 is used to provide a low impedance path for quickly pulling-up the gate of the output transistor 54 of the output circuit 30 of FIG. 1.

The bus assist circuit shown in FIG. 2 may be built with standard N-channel MOS transistors based on 3 and 4 micron polysilicon gate technology. The enhancement and depletion transistors shown are of the single threshold voltage type. Simulation of the bus assist circuit shown in FIG. 2 indicates that the rise time of an electronic signal on the data bus conductor 10 is shortened by 25% compared to the rise time on a conductor without the use of the bus assist circuit.

Thus, there has been shown and described a bus assist circuit which improves the rise time of an electronic signal on a data bus conductor of a data processing system wherein the voltage condition of the electronic signal is used to trigger the bus assist circuit. The described bus assist circuit, and its components, are exemplary only and may be replaced by equivalents by those skilled in the art, which equivalents are intended to be covered by the attached claims.

What is claimed is:

1. A circuit for decreasing the rise time of an electronic signal on a bus conductor, said circuit comprising:

reference voltage means having an output for providing a reference voltage;

comparator means having a first input connected to the output of said reference voltage means, a second input connected to the bus conductor and an output including a current source, said comparator means having an on state for conducting therethrough current from said current source when the electronic signal voltage on the bus conductor connected to its second input is lower than a set voltage related to the reference voltage on its first input, and a turned off condition for blocking current flow therethrough when the electronic signal voltage on the bus conductor connected to its second input rises to be equal to or exceeds the set voltage related to the reference voltage on its first input such that an enabling signal having a voltage at least equal to a set level will be provided on the output of said comparator means;

time delay means comprising at least three inverter devices connected in series, said time delay means having an input connected to the output of said comparator means and an output whose output voltage will be changed to be at least equal to said set level about ten nanoseconds after its input has received the enabling signal from the output of said comparator means;

a two state device having a first input connected to the output of said comparator means for receipt of the enabling signal, a second input connected to the output of said time delay means, and an output, the voltage on the output of said two state device having a first state when the voltages on both of the inputs of said two state device are at said set level, and a second state when either of the voltages on the inputs of said two state device is at a level different than said set level; and current providing means having an input connected to the output of said two state device and an output connected to the bus conductor, said current providing means having an on condition for providing current from its output to the bus conductor when the output voltage of said two state device is in its first state, and having an off condition when the output voltage of said two state device is in its second state, whereby the rise time of the electronic signal on the bus conductor is shortened when said current providing means is in its on condition.

2. The circuit of claim 1 wherein said two-state device is a NAND gate.

* * * * *